US012588538B2

(12) United States Patent
Mao et al.

(10) Patent No.: US 12,588,538 B2
(45) Date of Patent: Mar. 24, 2026

(54) SEMICONDUCTOR DEVICE HAVING WIRED UNDER BUMP STRUCTURE AND METHOD THEREFOR

(71) Applicant: NXP B.V., Eindhoven (NL)

(72) Inventors: Kuan-Hsiang Mao, Kaohsiung (TW); Shu-Han Yang, Kaohsiung (TW); Pey Fang Hiew, Kajang (MY); Wen Hung Huang, Kaosiung (TW)

(73) Assignee: NXP B.V., Eindhoven (NL)

( * ) Notice: Subject to any disclaimer, the term of this patent is extended or adjusted under 35 U.S.C. 154(b) by 415 days.

(21) Appl. No.: 18/322,658

(22) Filed: May 24, 2023

(65) Prior Publication Data

US 2024/0395674 A1     Nov. 28, 2024

(51) Int. Cl.
H01L 23/49          (2006.01)
H01L 23/00          (2006.01)

(52) U.S. Cl.
CPC .............. *H01L 23/49* (2013.01); *H01L 24/05* (2013.01); *H01L 24/06* (2013.01); *H01L 24/13* (2013.01); *H01L 2224/0231* (2013.01); *H01L 2224/0233* (2013.01); *H01L 2224/02373* (2013.01); *H01L 2224/02375* (2013.01); *H01L 2224/02377* (2013.01); *H01L 2224/02381* (2013.01); *H01L 2224/0239* (2013.01); *H01L 2224/05548* (2013.01); *H01L 2224/05647* (2013.01); *H01L 2224/13014* (2013.01); *H01L 2224/13021* (2013.01); *H01L 2224/13144* (2013.01); *H01L 2224/13147* (2013.01); *H01L 2924/01029* (2013.01)

(58) Field of Classification Search
CPC ......... H01L 23/49; H01L 24/05; H01L 24/06; H01L 24/13; H01L 2224/0231; H01L 2224/0233; H01L 2224/02373; H01L 2224/02375; H01L 2224/02377; H01L 2224/02381; H01L 2224/0239; H01L 2224/05548; H01L 2224/13014; H01L 2224/13021; H01L 2224/0401; H01L 2224/05555; H01L 2224/06515; H01L 24/45; H01L 23/3114; H01L 2224/02371; H01L 2224/04042; H01L 2224/4824; H01L 24/48
See application file for complete search history.

(56) References Cited

U.S. PATENT DOCUMENTS

| | | | |
|---|---|---|---|
| 5,148,266 A | | 9/1992 | Khandros et al. |
| 6,428,641 B1 | | 8/2002 | Yoon et al. |
| 7,550,857 B1 * | | 6/2009 | Longo ..................... H01L 24/19 |
| | | | 257/784 |
| 12,288,770 B2 * | | 4/2025 | Mao .................... H01L 25/0657 |
| 2003/0090884 A1 | | 5/2003 | Lee et al. |
| 2008/0157360 A1 | | 7/2008 | Lua et al. |
| 2012/0104606 A1 * | | 5/2012 | Okuda .................. H01L 21/565 |
| | | | 257/738 |

(Continued)

*Primary Examiner* — Douglas W Owens

(57)          ABSTRACT

A method of manufacturing a semiconductor device is provided. The method includes forming a redistribution layer (RDL) over an active side of a semiconductor die. A die pad of the semiconductor die is connected to an interconnect segment of the RDL by way of a bond wire. An encapsulating layer is formed over the active side of the semiconductor die such that exposed portions of the die pad and the bond wire are embedded in the encapsulating layer.

18 Claims, 7 Drawing Sheets

(56)  References Cited

U.S. PATENT DOCUMENTS

| 2013/0026658 | A1  | 1/2013  | Chen |  |
| 2014/0170814 | A1* | 6/2014  | Okuda | H01L 21/565 |
|              |     |         |       | 438/109 |
| 2019/0295986 | A1* | 9/2019  | Oh    | H01L 24/13 |
| 2022/0336388 | A1* | 10/2022 | Yang  | H01L 24/73 |
| 2025/0174507 | A1* | 5/2025  | Mao   | H01L 23/13 |

\* cited by examiner

SEMICONDUCTOR DEVICE HAVING WIRED UNDER BUMP STRUCTURE AND METHOD THEREFOR

BACKGROUND

Field

This disclosure relates generally to semiconductor device packaging, and more specifically, to a semiconductor device having wired under-bump structure and method of forming the same.

Related Art

Today, the electronics industry continues to rely upon advances in semiconductor technology to realize higher-function devices in more compact areas. For many applications realizing higher-functioning devices requires integrating a large number of electronic devices into a single silicon wafer. As the number of electronic devices per given area of the silicon wafer increases, the manufacturing process becomes more difficult. The packaging of such devices is playing an increasing role in the devices' performance. For example, wafer level packaged devices may be used in the manufacture of mobile products (e.g., mobile phones, tablet computers, laptop computers, remote controls, etc.) saving valuable space in mobile applications. During manufacturing, these packaged devices may be subjected to a number of processes which may affect product yield and product reliability. The yield has a direct bearing on the cost of the finished product and the reliability affects the longevity of the finished product. Accordingly, there is a need for advanced packaging processes which can address such challenges.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having a wired under-bump structure. A redistribution layer is formed over an active side of semiconductor die in wafer level packaging. The redistribution layer is patterned to form a plurality of interconnect segments. The interconnect segments include a wiring pad region, an under-bump region, and a trace portion connecting the wiring pad region with the under-bump region. Bond wires are configured to connect die pads of the semiconductor die with the wiring pad regions of the interconnect segments, and ball connectors (e.g., solder balls) are configured to connect under-bump regions of the interconnect segments with a printed circuit board, for example. In this manner, die pads of the semiconductor die are interconnected with the printed circuit board by way of the interconnect segments of the redistribution layer. A non-conductive layer is deposited or otherwise applied over the active side of the semiconductor die as an encapsulating layer. The non-conductive layer encapsulates exposed portions of the die pads, bond wire, and interconnect segments. The non-conductive layer may be formed from a suitable polymer dielectric material or an epoxy molding compound, for example. Openings are formed in the non-conductive layer to expose top surface portions of the under-bump regions. The ball connectors are attached and connected to the exposed top surface portions of the under-bump regions. After encapsulating with the non-conductive layer and connecting ball connectors to the exposed under-bump regions, individual semiconductor devices may be singulated from the wafer form. By forming semiconductor devices utilizing wafer level packaging in this manner, a simplified under-bump structure is formed and connected to die such that manufacturing costs may be significantly reduced.

Figure 1:
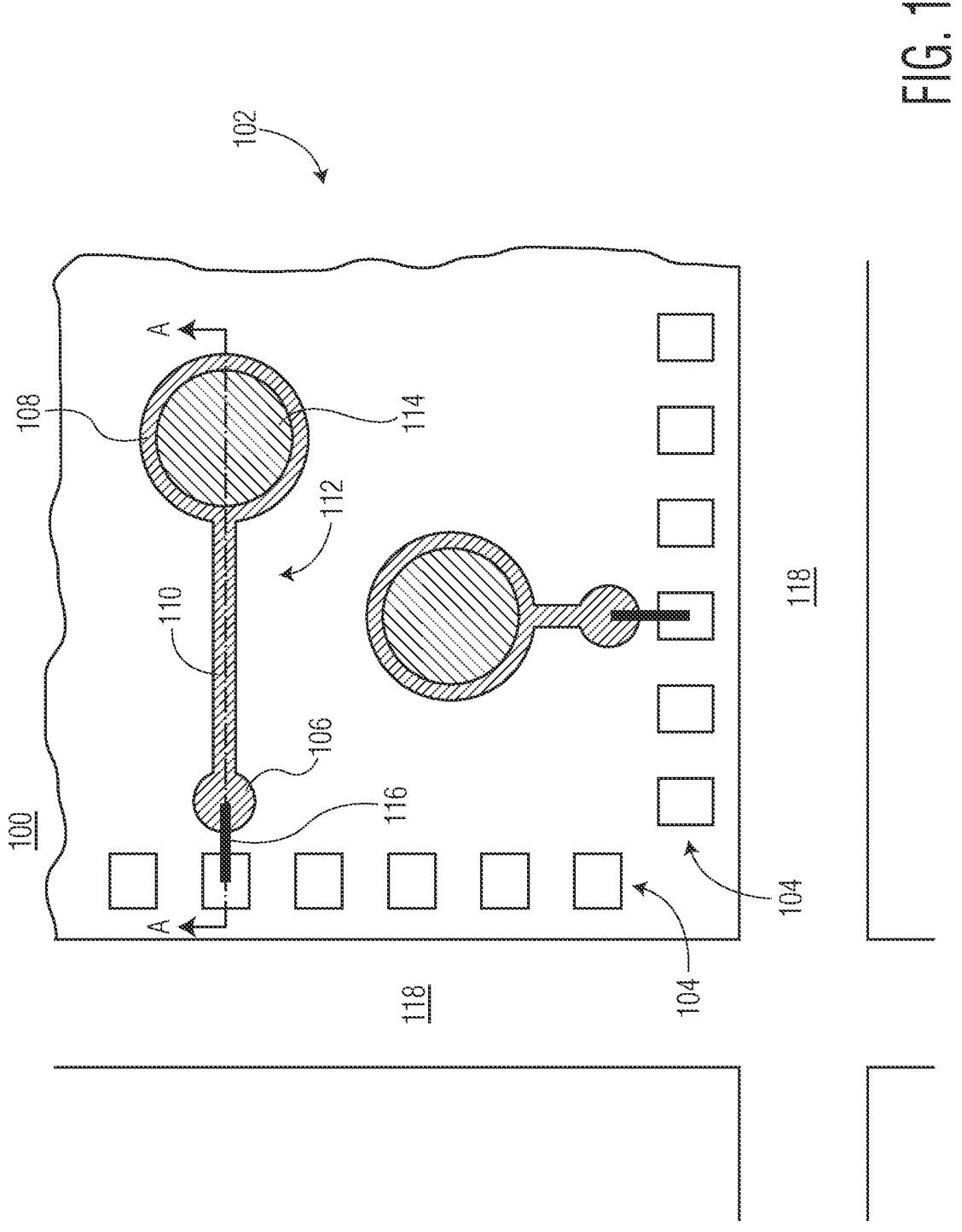
FIG. 1 illustrates, in a simplified plan view, an example semiconductor device having a wired under bump structure in accordance with an embodiment.

FIG. 1 illustrates, in a simplified plan view, a portion of an example semiconductor device 100 having a wired under bump structure in accordance with an embodiment. The device 100 depicted in FIG. 1 is shown at a stage of manufacture including a wafer or portion of a wafer. At this stage, the device 100 includes a semiconductor die 102 separated from other die sites by way of singulation streets 118. The device 100 further includes die pads 104 formed on the semiconductor die 102 and a redistribution layer (RDL) formed over the semiconductor die. The RDL may be formed as a build-up package substrate or may be provided as a pre-formed package substrate. The RDL may be formed from a copper, copper alloy, or other suitable metal material. In this embodiment, the RDL is a conductive layer patterned to form a plurality of interconnect segments (e.g., 112) connected to respective die pads by way of bond wires (e.g., 116). For example, the interconnect segment 112 includes a wiring pad region 106 connected to a die pad 104 by way of bond wire 116, an under-bump region 108, and a trace portion 110 connecting the wiring pad region 106 with the under-bump region 114. A conductive ball connector 114 is affixed to the under-bump region 108 of the interconnect segment 112. The conductive ball connectors (e.g., solder balls) 114 affixed to the under-bump regions of device 100 may be in the form of suitable conductive structures such as solder balls, gold studs, copper pillars, and the like. The term "conductive," as used herein, generally refers to electrical conductivity unless otherwise described.

Detailed features of the device 100 such as dielectric layers formed over the top passivation layer of the semiconductor die and package encapsulant are not shown for illustration purposes. Even though the embodiment of FIG. 1 is depicted in a "fan-in" configuration, embodiments in other configurations (e.g., "fan-out") are anticipated by this disclosure. Cross-sectional views of the example semiconductor device 100 taken along line A-A of FIG. 1 at stages of manufacture are depicted in FIG. 2 through FIG. 7.

FIG. 2 through FIG. 7 illustrate, in simplified cross-sectional views, a portion 200 of the example semiconductor device 100 taken along line A-A of FIG. 1 at stages of manufacture in accordance with an embodiment.

Figure 2:
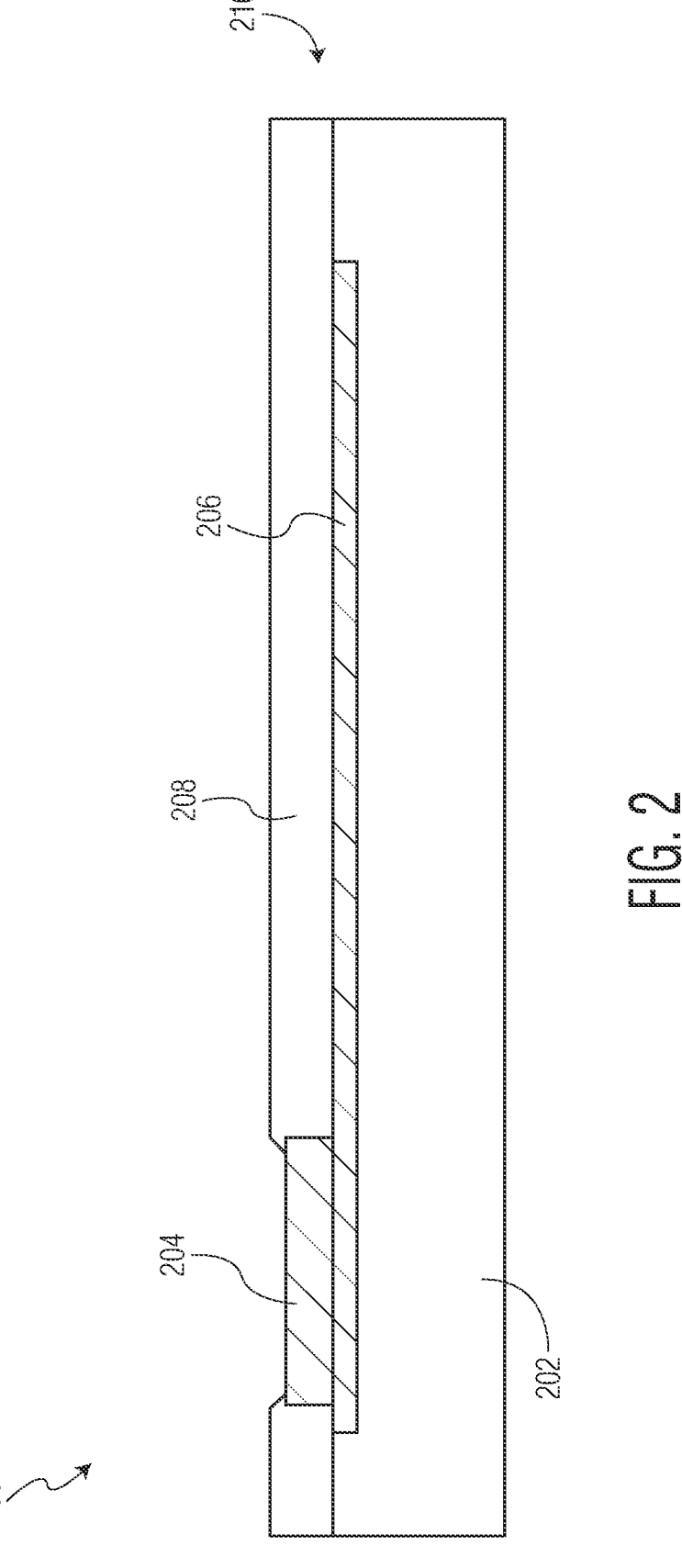
FIG. 2 through FIG. 7 illustrate, in simplified cross-sectional views, the example semiconductor device taken along line A-A of FIG. 1 at stages of manufacture in accordance with an embodiment.

FIG. 2 illustrates, in a simplified cross-sectional view, the example semiconductor device portion 200 at a stage of manufacture in accordance with an embodiment. At this stage of manufacture, a semiconductor die 210 is provided. In this embodiment, the semiconductor die 210 includes a substrate 202 (e.g., bulk), a conductive interconnect trace 206 (e.g., copper, aluminum, or other suitable metal), a die pad 204 conductively connected to the trace, and a final passivation layer 208 formed over the active side of the die. In some embodiments, the semiconductor die 210 may be provided as a wafer or portion of a wafer. The semiconductor die may include any number of conductive interconnect layers and passivation layers. For illustration purposes, a top interconnect layer forming trace 206 and a final passivation layer 208 are depicted.

In this embodiment, the semiconductor die 210 of FIG. 2 corresponds to the semiconductor die 102 of FIG. 1. The semiconductor die 210 has an active side (e.g., major side having circuitry) and a backside (e.g., major side opposite of the active side). The semiconductor die 210 depicted in FIG. 1 is in an active side up orientation. The semiconductor die 210 includes a die pad 204 at the active side configured for connection to an interconnect segment of an RDL formed at a subsequent stage of manufacture, for example. The semiconductor die 210 may be formed from any suitable semiconductor material, such as silicon, germanium, gallium arsenide, gallium nitride, silicon nitride, silicon carbide, and the like. The semiconductor die 210 may further include any digital circuits, analog circuits, RF circuits, memory, signal processor, MEMS, sensors, the like, and combinations thereof.

Figure 3:
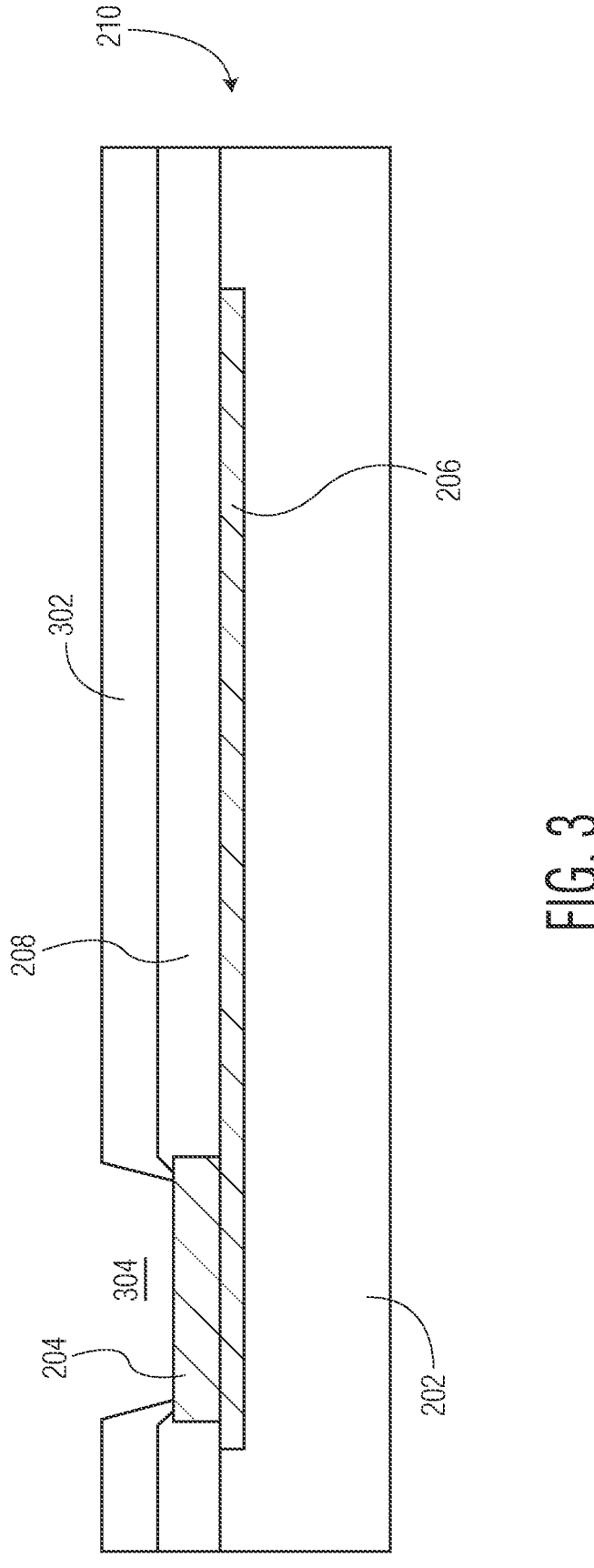

FIG. 3 illustrates, in a simplified cross-sectional view, the example semiconductor device portion 200 at a subsequent stage of manufacture in accordance with an embodiment. At this stage of manufacture, a non-conductive layer 302 is formed over the semiconductor die 210. The non-conductive layer 302 is deposited or otherwise applied on the top surface of the semiconductor die 210. The non-conductive 302 layer may be formed from a suitable polymer dielectric material, for example. The non-conductive layer 302 may be characterized as a low dielectric constant polymer dielectric material layer such as SiO2, fluorosilicate glass (FSG), polyimide, benzocyclobutene (BCB), and the like. In this embodiment, an opening 304 is patterned and formed in the non-conductive layer 302. The opening 304 may be formed using known laser ablation or masking, exposure, and etch techniques, for example. The opening 304 is formed through the non-conductive layer 302 and located over the die pad 204 such that a substantial portion of a top surface of the die pad 204 is exposed.

Figure 4:
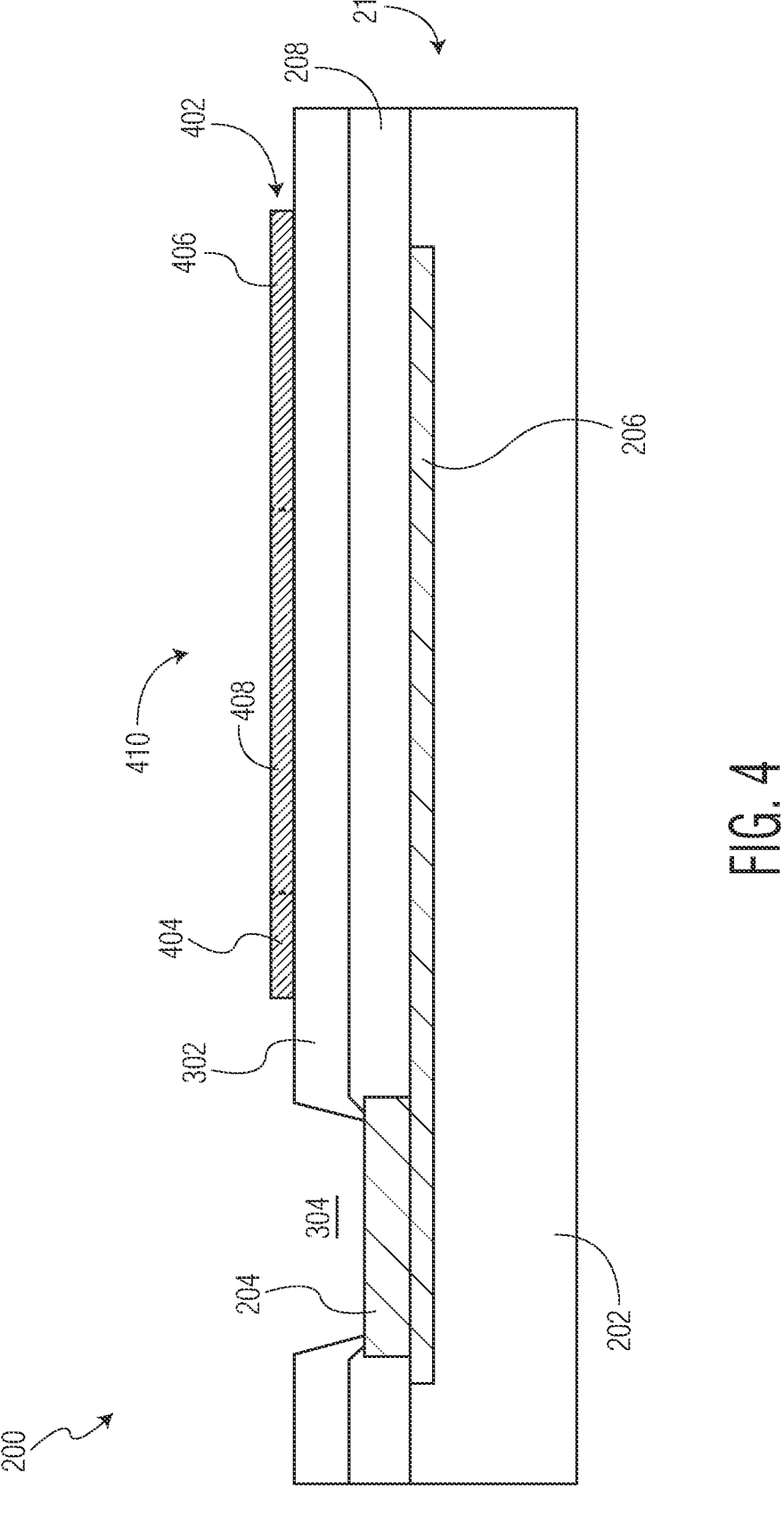

FIG. 4 illustrates, in a simplified cross-sectional view, the example semiconductor device portion 200 at a subsequent stage of manufacture in accordance with an embodiment. At this stage of manufacture, a conductive layer 402 is formed over the non-conductive layer 302 and patterned to form an interconnect segment 410. The conductive layer 402 may be formed by way of a metal plating process or may be applied as a conductive film, for example. Alternatively, the conductive layer 402 and underlying the non-conductive layer 302 may be applied together on the top surface of the semiconductor die 210 as a pre-formed laminate layer.

In this embodiment, the conductive (e.g., copper, copper alloy) layer 402 is characterized as an RDL and configured to form the interconnect segment 410. The interconnect segment 410 includes a wiring pad region 404, an under-bump region 406, and a trace portion 408 connecting the wiring pad region 404 with the under-bump region 406. For example, the wiring pad region 404 is configured for connection to the die pad 204 by way of a bond wire formed at a subsequent stage of manufacture and the under-bump region is configured for connection to a printed circuit board (PCB) by way of a conductive ball connector formed at a subsequent stage of manufacture. In this embodiment, the interconnect segment 410 of the RDL does not directly contact the die pad 204 of the semiconductor die 210.

Figure 5:
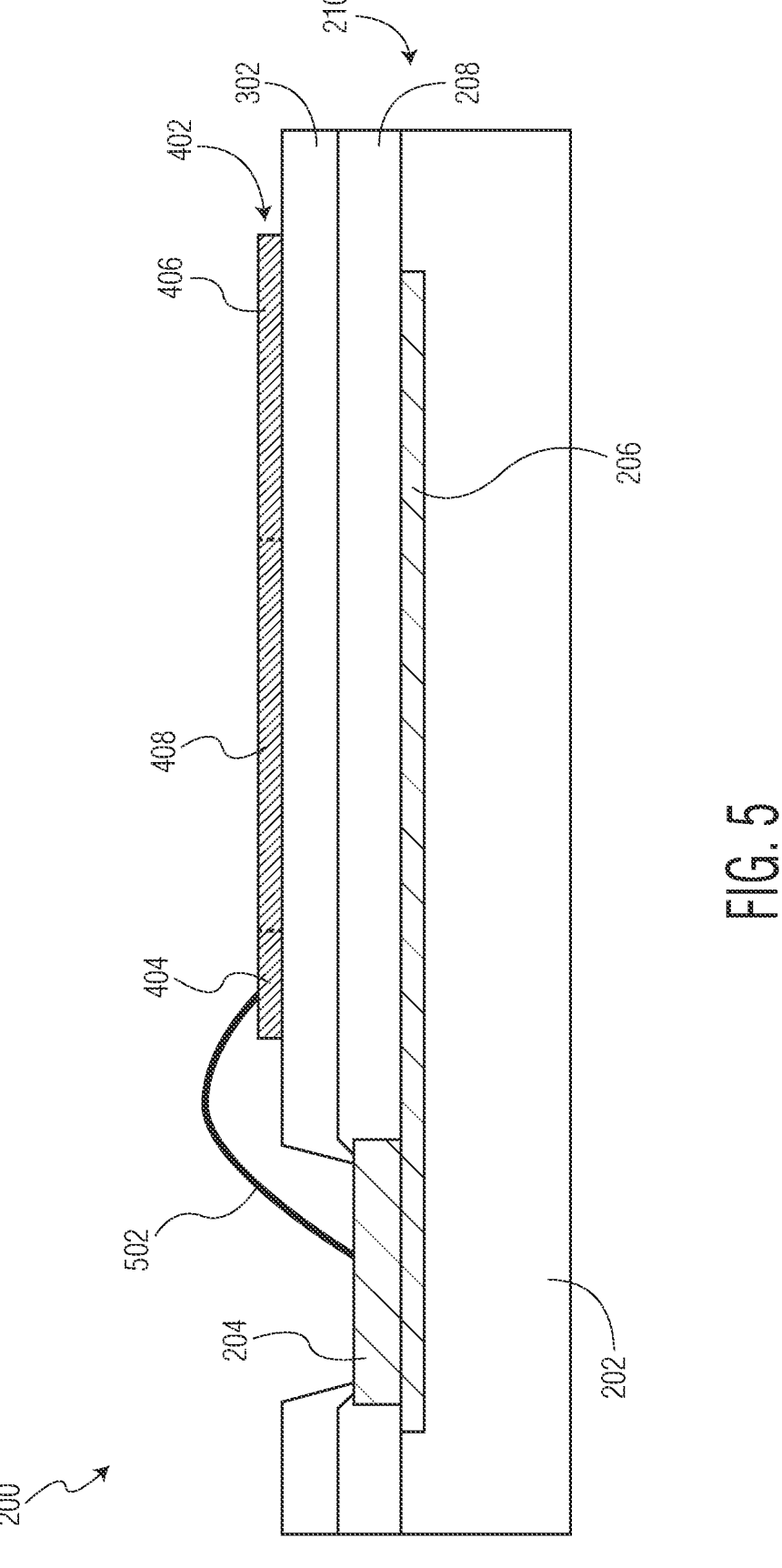

FIG. 5 illustrates, in a simplified cross-sectional view, the example semiconductor device portion 200 at a subsequent stage of manufacture in accordance with an embodiment. At this stage of manufacture, a bond wire 502 is formed to conductively connect the die pad 204 with the interconnect segment 410. In this embodiment, a first end of the bond wire 502 is attached at the die pad 204 and a second end of the bond wire 502 is attached at the wiring pad region 404 of the interconnect segment 410. The bond wire 502 may be formed for a copper, copper alloy, or other suitable metal material.

Figure 6:
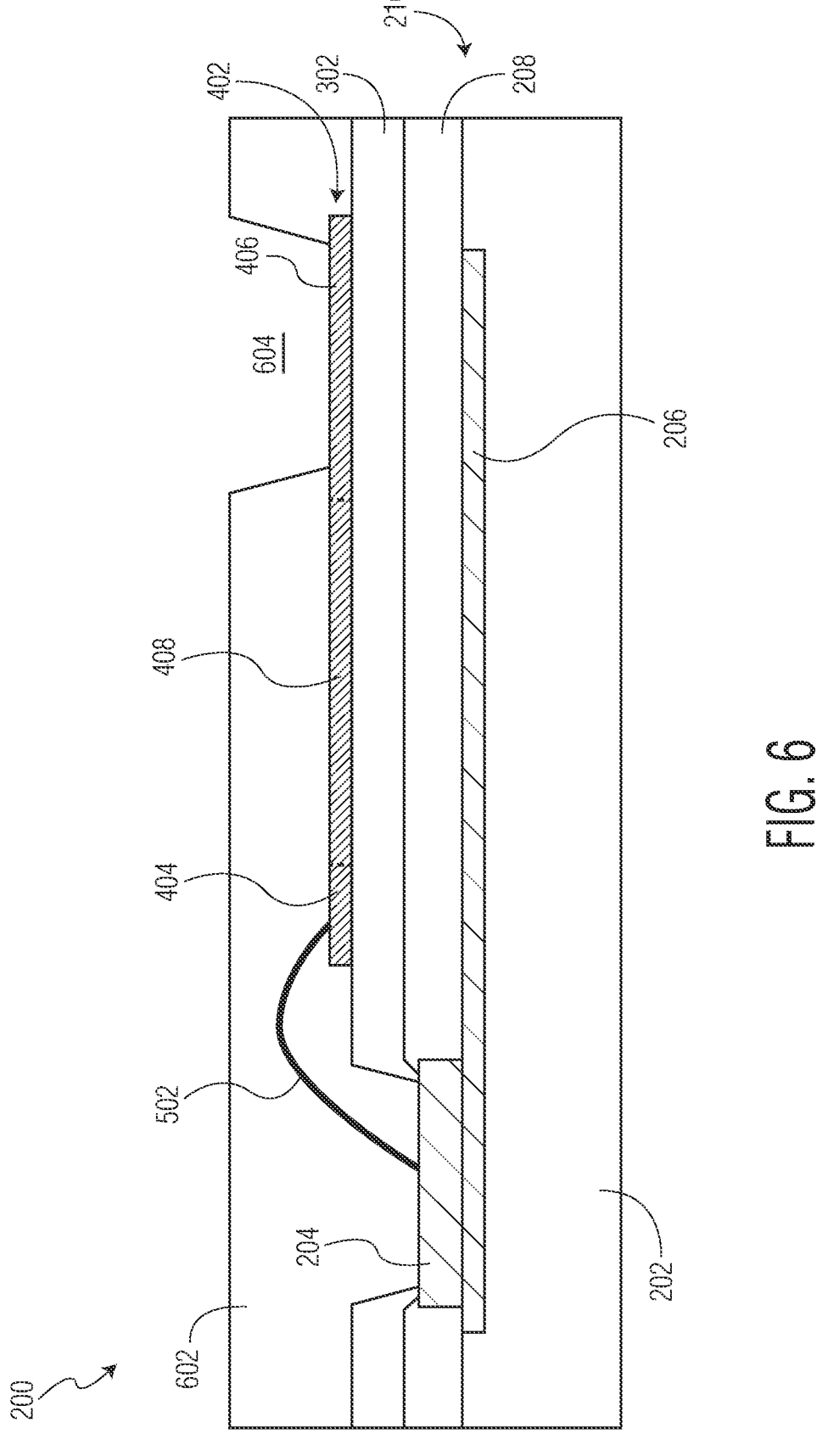

FIG. 6 illustrates, in a simplified cross-sectional view, the example semiconductor device portion 200 at a subsequent stage of manufacture in accordance with an embodiment. At this stage of manufacture, a non-conductive layer 602 is formed over the semiconductor die 210. The non-conductive layer 602 is deposited or otherwise applied over the active side of the semiconductor die 210. In this embodiment, the non-conductive layer 602 is formed as an encapsulating layer over the active side of the semiconductor die 210 such that exposed portions of the die pad 204, the bond wire 502, and the interconnect segment 410 are embedded in the encapsulating layer. The non-conductive layer 602 may be formed from a suitable polymer dielectric material (e.g., SiO2, FSG, polyimide, BCB) or an epoxy molding compound, for example. The non-conductive 602 layer may be formed as a single layer or may be formed as a plurality of layers to achieve an overall non-conductive layer 602 thickness sufficient to encapsulate the exposed portions of the die pad 204, the bond wire 502, and the interconnect segment 410.

In this embodiment, an opening 604 is patterned and formed in the non-conductive layer 602. The opening 604 may be formed using known laser ablation or masking, exposure, and etch techniques, for example. The opening 604 is formed through the non-conductive layer 602 and located over the under-bump region 406 of the interconnect segment 410 such that a substantial portion of a top surface of the under-bump region 406 is exposed. In some embodiments, it may be desirable to subject the exposed under-bump region 406 to a plating process to build up under-bump metallization prior to attachment of a conductive ball connector at a subsequent stage of manufacture.

Figure 7:
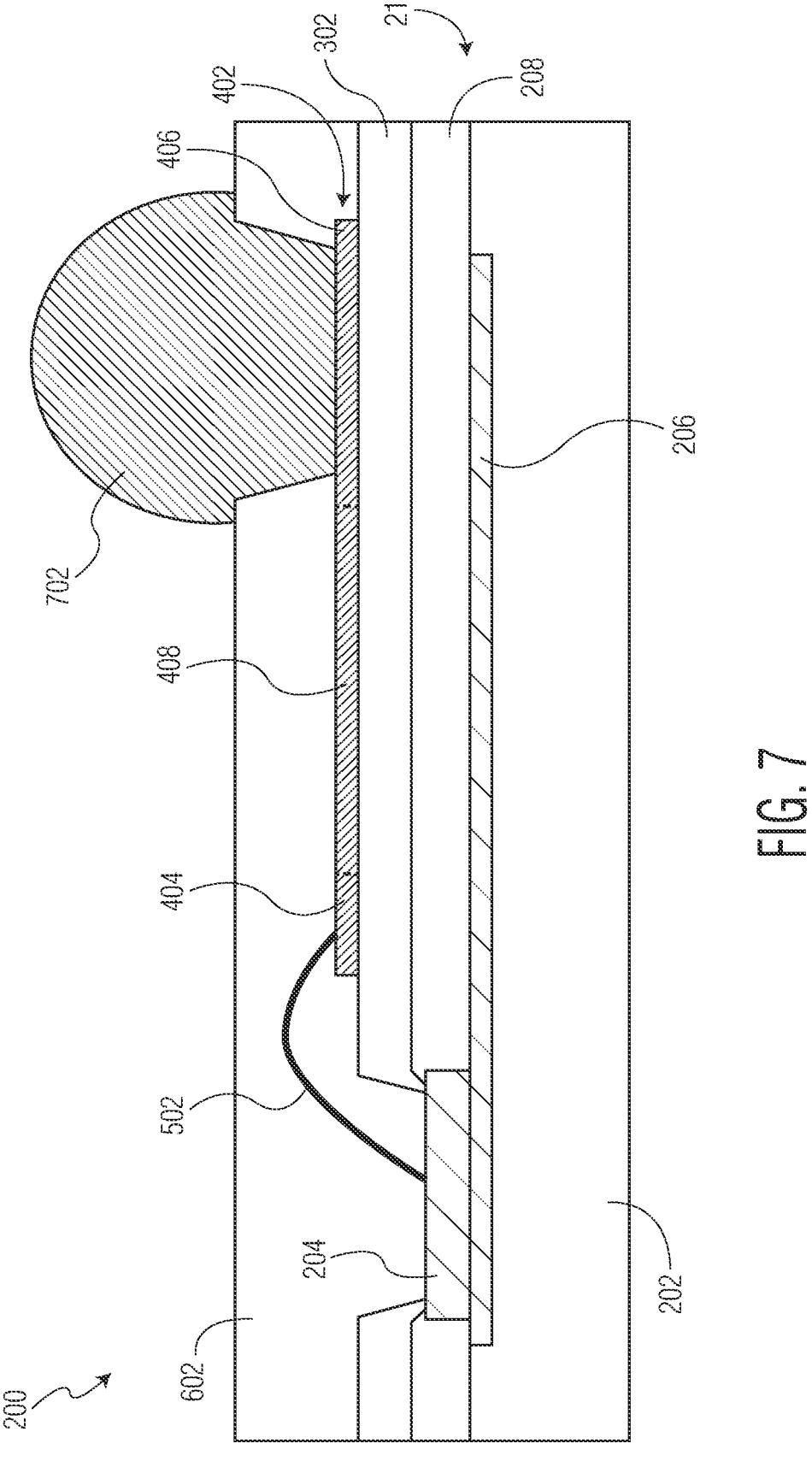

FIG. 7 illustrates, in a simplified cross-sectional view, the example semiconductor device portion 200 at a subsequent stage of manufacture in accordance with an embodiment. At this stage of manufacture, a conductive ball connector 702 (e.g., solder ball) is attached to the exposed surface of the under-bump region 406. The conductive ball connector 702 is placed into the opening over the exposed surface of the under-bump region 406 and reflowed. A flux material may be placed in the opening before placing the conductive ball connector 702 onto the surface of the under-bump region 406 to improve wetting and adhesion. In this embodiment, the conductive ball connector 702 is formed as a solder ball. In other embodiments, the conductive ball connector 702 may be formed as a solder bump, gold stud, copper pillar, or the like.

After encapsulating the exposed portions of the die pad 204, the bond wire 502, and the interconnect segment 410 with the non-conductive 602 layer and affixing the conductive ball connector 702 to the exposed surface of the under-bump region 406, the wafer or portion of the wafer depicted in FIG. 1 may be singulated along the singulation streets 118 to form discrete semiconductor devices 100.

Generally, there is provided, a method including forming a redistribution layer (RDL) over an active side of a semiconductor die; connecting a die pad of the semiconductor die with an interconnect segment of the RDL by way of a bond wire; and forming an encapsulating layer over the active side of the semiconductor die such that exposed portions of the die pad and the bond wire are embedded in the encapsulating layer. The forming the RDL may include depositing a non-conductive layer over the semiconductor die; forming an opening in the non-conductive layer, the opening exposing a portion of the die pad of the semiconductor die; and forming the RDL on the non-conductive layer, the RDL patterned to form the interconnect segment. The non-conductive layer may be formed directly on a passivation layer of the semiconductor die. The non-conductive layer may be characterized as a polymer dielectric material layer. The interconnect segment of the RDL may include a wiring pad region, an under-bump region, and a trace portion connecting the wiring pad region with the under-bump region. The method may further include forming an opening in the encapsulating layer to expose a portion of the under-bump region of the interconnect segment, the exposed portion of the under-bump region configured for attachment of a ball connector. The encapsulating layer may be characterized as a polymer dielectric material layer or an epoxy molding compound layer. The interconnect segment of the RDL may be located directly over the active side of the semiconductor die and does not overlap the die pad. The interconnect segment of the RDL may be formed from a copper or copper alloy material.

In another embodiment, there is provided, a semiconductor device including a redistribution layer (RDL) formed over an active side of a semiconductor die, the RDL including an interconnect segment; a die pad of the semiconductor die connected to the interconnect segment by way of a bond wire; and an encapsulating layer formed over the active side of the semiconductor die such that exposed portions of the die pad and the bond wire are embedded in the encapsulating layer. The semiconductor device may further include a non-conductive layer disposed between a passivation layer of the semiconductor die and the RDL. The interconnect segment of the RDL may include a wiring pad region, an under-bump region, and a trace portion connecting the wiring pad region with the under-bump region. The semiconductor device may further include forming an opening in the encapsulating layer exposing a portion of the under-bump region of the interconnect segment, the exposed portion of the under-bump region configured for attachment of a ball connector. The interconnect segment of the RDL may be located directly over the active side of the semiconductor die and does not overlap the die pad. The encapsulating layer may be characterized as a polymer dielectric material layer or an epoxy molding compound layer.

In yet another embodiment, there is provided, a method including forming a redistribution layer (RDL) over an active side of a semiconductor die, an interconnect segment of the RDL including a wiring pad region, an under-bump region, and a trace portion connecting the wiring pad region with the under-bump region; connecting a die pad of the semiconductor die with the wiring pad region of the interconnect segment by way of a bond wire; and forming an encapsulating layer over the active side of the semiconductor die such that exposed portions of the die pad and the bond wire are embedded in the encapsulating layer. The forming the RDL may include depositing a non-conductive layer over the semiconductor die; forming an opening in the non-conductive layer, the opening exposing a portion of the die pad of the semiconductor die; and forming the RDL on the non-conductive layer, the RDL patterned to form the interconnect segment. The non-conductive layer may be formed directly on a passivation layer of the semiconductor die. The non-conductive layer may be characterized as a polymer dielectric material layer. The method may further include forming an opening in the encapsulating layer to expose a portion of the under-bump region of the interconnect segment, the exposed portion of the under-bump region configured for attachment of a ball connector.

By now, it should be appreciated that there has been provided a semiconductor device having a wired under-bump structure. A redistribution layer is formed over an active side of semiconductor die in wafer level packaging. The redistribution layer is patterned to form a plurality of interconnect segments. The interconnect segments include a wiring pad region, an under-bump region, and a trace portion connecting the wiring pad region with the under-bump region. Bond wires are configured to connect die pads of the semiconductor die with the wiring pad regions of the interconnect segments, and ball connectors (e.g., solder balls) are configured to connect under-bump regions of the interconnect segments with a printed circuit board, for example. In this manner, die pads of the semiconductor die are interconnected with the printed circuit board by way of the interconnect segments of the redistribution layer. A non-conductive layer is deposited or otherwise applied over the active side of the semiconductor die as an encapsulating layer. The non-conductive layer encapsulates exposed portions of the die pads, bond wire, and interconnect segments. The non-conductive layer may be formed from a suitable polymer dielectric material or an epoxy molding compound, for example. Openings are formed in the non-conductive layer to expose top surface portions of the under-bump regions. The ball connectors are attached and connected to the exposed top surface portions of the under-bump regions. After encapsulating with the non-conductive layer and connecting ball connectors to the exposed under-bump regions, individual semiconductor devices may be singulated from the wafer form. By forming semiconductor devices utilizing wafer level packaging in this manner, a simplified under-bump structure is formed and connected to die such that manufacturing costs may be significantly reduced.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:

forming a redistribution layer (RDL) over an active side of a semiconductor die;

connecting a die pad of the semiconductor die with an interconnect segment of the RDL by way of a bond wire, wherein the interconnect segment of the RDL includes a wiring pad region, an under-bump region, and a trace portion connecting the wiring pad region with the under-bump region; and forming an encapsulating layer over the active side of the semiconductor die such that exposed portions of the die pad and the bond wire are embedded in the encapsulating layer.

2. The method of claim 1, wherein forming the RDL includes:

depositing a non-conductive layer over the semiconductor die;

forming an opening in the non-conductive layer, the opening exposing a portion of the die pad of the semiconductor die; and forming the RDL on the non-conductive layer, the RDL patterned to form the interconnect segment.

3. The method of claim 2, wherein the non-conductive layer is formed directly on a passivation layer of the semiconductor die.

4. The method of claim 2, wherein the non-conductive layer is characterized as a polymer dielectric material layer.

5. The method of claim 1, further comprising forming an opening in the encapsulating layer to expose a portion of the under-bump region of the interconnect segment, the exposed portion of the under-bump region configured for attachment of a ball connector.

6. The method of claim 1, wherein the encapsulating layer is characterized as a polymer dielectric material layer or an epoxy molding compound layer.

7. The method of claim 1, wherein the interconnect segment of the RDL is located directly over the active side of the semiconductor die and does not overlap the die pad.

8. The method of claim 1, wherein the interconnect segment of the RDL is formed from a copper or copper alloy material.

9. A semiconductor device comprising:

a redistribution layer (RDL) formed over an active side of a semiconductor die, the RDL including an interconnect segment;

a die pad of the semiconductor die connected to the interconnect segment by way of a bond wire;

an encapsulating layer formed over the active side of the semiconductor die such that exposed portions of the die pad and the bond wire are embedded in the encapsulating layer; and a non-conductive layer disposed between a passivation layer of the semiconductor die and the RDL.

10. The semiconductor device of claim 9, wherein the interconnect segment of the RDL includes a wiring pad region, an under-bump region, and a trace portion connecting the wiring pad region with the under-bump region.

11. The semiconductor device of claim 10, further comprising forming an opening in the encapsulating layer exposing a portion of the under-bump region of the interconnect segment, the exposed portion of the under-bump region configured for attachment of a ball connector.

12. The semiconductor device of claim 9, wherein the interconnect segment of the RDL is located directly over the active side of the semiconductor die and does not overlap the die pad.

13. The semiconductor device of claim 9, wherein the encapsulating layer is characterized as a polymer dielectric material layer or an epoxy molding compound layer.

14. A method comprising:

forming a redistribution layer (RDL) over an active side of a semiconductor die, an interconnect segment of the RDL including a wiring pad region, an under-bump region, and a trace portion connecting the wiring pad region with the under-bump region;

connecting a die pad of the semiconductor die with the wiring pad region of the interconnect segment by way of a bond wire; and forming an encapsulating layer over the active side of the semiconductor die such that exposed portions of the die pad and the bond wire are embedded in the encapsulating layer.

15. The method of claim 14, wherein forming the RDL includes:

depositing a non-conductive layer over the semiconductor die;

forming an opening in the non-conductive layer, the opening exposing a portion of the die pad of the semiconductor die; and forming the RDL on the non-conductive layer, the RDL patterned to form the interconnect segment.

16. The method of claim 15, wherein the non-conductive layer is formed directly on a passivation layer of the semiconductor die.

17. The method of claim 15, wherein the non-conductive layer is characterized as a polymer dielectric material layer.

18. The method of claim 14, further comprising forming an opening in the encapsulating layer to expose a portion of the under-bump region of the interconnect segment, the exposed portion of the under-bump region configured for attachment of a ball connector.

* * * * *